United States Patent
Jeon

(10) Patent No.: US 6,759,346 B1
(45) Date of Patent: Jul. 6, 2004

(54) METHOD OF FORMING DIELECTRIC LAYERS

(75) Inventor: Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 87 days.

(21) Appl. No.: 10/270,325

(22) Filed: Oct. 15, 2002

(51) Int. Cl.⁷ .............................................. H01L 21/31

(52) U.S. Cl. ...................... 438/763; 438/793; 438/503; 438/507; 438/648

(58) Field of Search ................................ 438/493, 503, 438/507, 648, 763

(56) References Cited

U.S. PATENT DOCUMENTS 6,607,973 B1 * 8/2003 Jeon ............................ 438/591
2003/0124871 A1 * 7/2003 Arghavani et al. .......... 438/763

* cited by examiner

*Primary Examiner*—Ernest Karlsen
*Assistant Examiner*—Lisa Kilday
(74) *Attorney, Agent, or Firm*—Harrity & Snyder, LLP

(57) ABSTRACT

A method of forming a dielectric layer includes placing a semiconductor wafer in a reaction chamber. Oxygen, hafnium and silicon sources are separately provided to the reaction chamber to react with the wafer. After each source has reacted, a monolayer or near-monolayer film is produced. Each source may also be provided to the reaction chamber a number of times to achieve a film having the desired thickness.

18 Claims, 6 Drawing Sheets

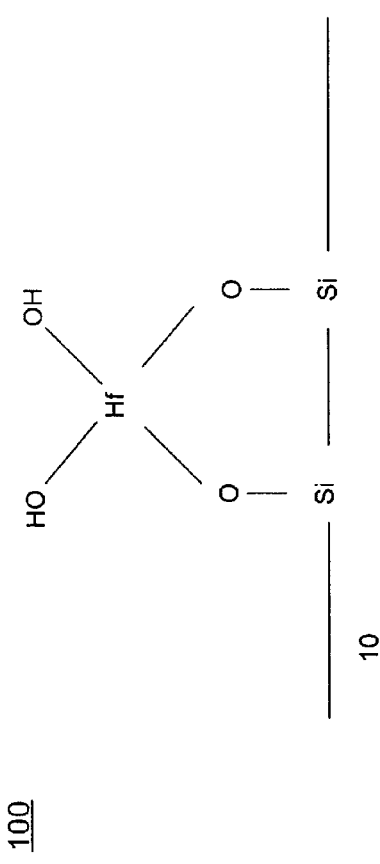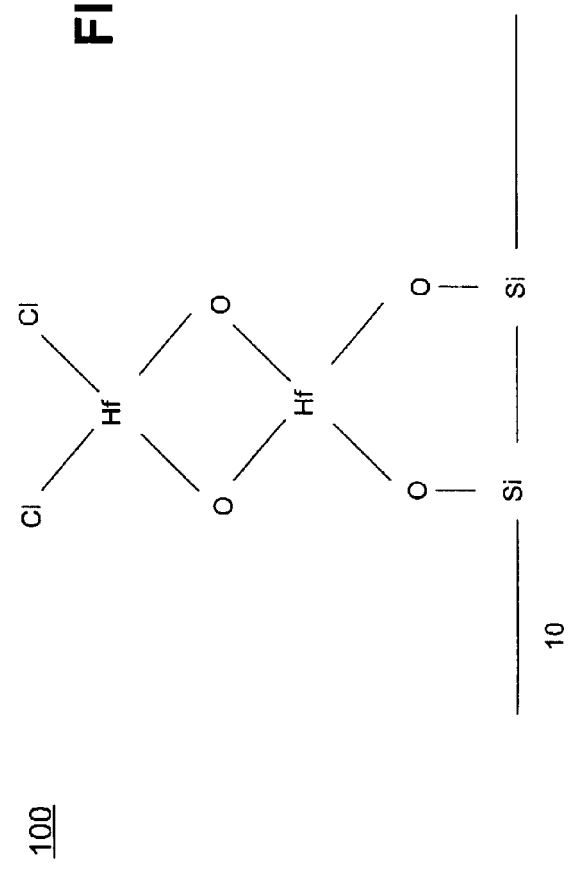

METHOD OF FORMING DIELECTRIC LAYERS

TECHNICAL FIELD

The present invention relates generally to semiconductor devices and, more particularly, to a method of forming dielectric layers having high dielectric constants.

BACKGROUND ART

Various dielectric films are typically required in semiconductor devices. For example, dielectric films are often used as interlayers between conductive layers on the semiconductor device. Some of these dielectric films are required to have a high dielectric constant (K). The high K films are often deposited using conventional chemical vapor deposition (CVD) techniques.

One problem associated with using conventional CVD techniques to deposit high K films is that it is difficult to scale the CVD process to produce thin films having the desired thickness with consistent composition throughout the film. Another problem with conventional CVD techniques is that the resulting dielectric film often does not exhibit good thermal stability throughout the film due to composition control problems.

DISCLOSURE OF THE INVENTION

There exists a need for a method of forming a dielectric layer having consistent composition for improved stability. There also exists a need for a method of forming a dielectric layer that can be easily scaled to achieve the desired thickness.

These and other needs are met by the present invention, where a series of molecular layer (monolayer) depositions may be performed a number of times to produce a dielectric film having the desired K value. The process may also be easily scaled to produce a film having a targeted thickness.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming a dielectric layer on a semiconductor substrate. The method includes transporting the semiconductor substrate to a reaction chamber and providing an oxygen source, a hafnium source and a silicon source to the reaction chamber in a series of separate respective processes. The oxygen, hafnium and silicon sources react to form a plurality of films on the semiconductor substrate, where the films form the dielectric layer.

According to another aspect of the invention, a method of manufacturing a semiconductor device includes providing a wafer having an exposed surface comprising silicon and transporting the semiconductor wafer to a reaction chamber. The method also includes alternately providing an oxygen source and a hafnium source to the reaction chamber in a first series of separate respective processes, where the oxygen source and hafnium source react with the wafer to form a first number of films on the wafer. The method further includes alternately providing a silicon source and an oxygen source to the reaction chamber in a second series of separate respective processes, wherein the silicon source and the oxygen source react to form a second number of films on the wafer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 1–8 illustrate the cross-section of a dielectric layer formed in accordance with an embodiment of the present invention.

BEST MODE FOR CARRYING OUT THE INVENTION

The present invention forms a high K film, such as an $HfSi_xO_y$ film, via a series of molecular layer depositions. A semiconductor wafer is placed in a reaction chamber, such as a conventional CVD chamber, and various gases are provided to react with the semiconductor wafer. After each gas has reacted, a monolayer or near-monolayer film is produced. Each gas may also be cycled into the CVD chamber a number of times to achieve a film having the desired thickness. The resulting film has a high K value and exhibits good stability.

Figure 1:
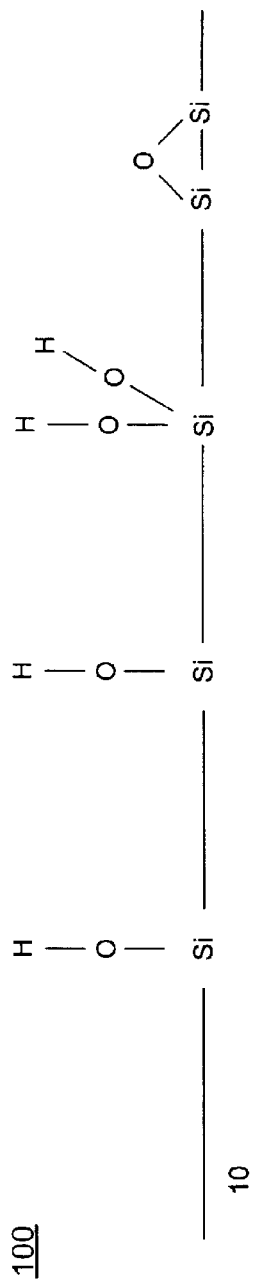

FIGS. 1–8 illustrate an exemplary process for forming a high K film in accordance with an embodiment of the present invention. Referring to FIG. 1, semiconductor device 100 includes substrate 10 comprising doped monocrystalline silicon. Substrate 10 may be doped with p-type impurities or n-type impurities based on the particular end device that is desired. For example, for a p-channel transistor, substrate 10 may be doped with p-type impurities, such as boron. For an n-channel transistor, substrate 10 may be doped with n-type impurities, such as arsenic.

A dielectric layer, such as a gate dielectric layer, may then be formed on semiconductor substrate 10. In an exemplary embodiment, the dielectric layer may be a high K layer formed using an atomic layer deposition (ALD) process. The ALD process, consistent with the present invention, may be performed using, for example, a conventional CVD chamber in which a thin dielectric film is deposited using a series of self-limiting surface reactions, as described in detail below.

In an exemplary embodiment of the present invention, during the ALD process, the CVD chamber, also referred to hereafter as the reaction chamber, is prepared as a vacuum chamber. For example, the reaction chamber may be prepared with a pressure in the range of about 10 mTorr to about 500 Torr. The reaction chamber may also be heated to a temperature of about 150° C. to about 700° C.

After the proper pressure and temperature in the reaction chamber are set, the surface of substrate 10 may be prepared by introducing a reactant gas (also referred to as a precursor) that acts as an oxygen source into the reaction chamber. For example, $H_2O$, $NO$, $N_2O$, $O_2$, $O_3$ and O radicals may be used as precursors that act as oxygen sources for the subsequent reaction with the substrate 10.

In an exemplary implementation of the present invention, $H_2O$ may be introduced into the reaction chamber at a flow rate ranging from about 20 standard cubic centimeters per minute (sccm) to about 500 sccm for about 10 milliseconds (ms) to about 1 second. Referring to FIG. 1, the oxygen atoms in the $H_2O$ bond with the silicon atoms on the surface of substrate 10. As shown in FIG. 1, the oxygen may bond with the silicon atoms on the surface of substrate 10 in a number of different ways. For example, an oxygen atom may bond with one or more silicon atoms on the surface of substrate 10.

After the $H_2O$ has been provided for the desired time, the $H_2O$ source to the reaction chamber is shut off and the reaction chamber is purged to flush all unreacted $H_2O$ from the chamber. For example, $N_2$ may be introduced to the reaction chamber at a flow rate ranging from about 100 sccm to about 2000 seem for a period of about 10 ms to about 10 seconds to purge the reaction chamber. It should be understood that other gases may also be used to purge the reaction chamber After the reaction chamber has been purged, a precursor that acts as a hafnium (Hf) source may introduced into the reaction chamber. For example, $HfCl_4$, $HfCl_3H$, $HfCl_2H_2$ and $HfClH_3$ may be used as precursors that act as Hf sources for the subsequent reaction.

Figure 2:
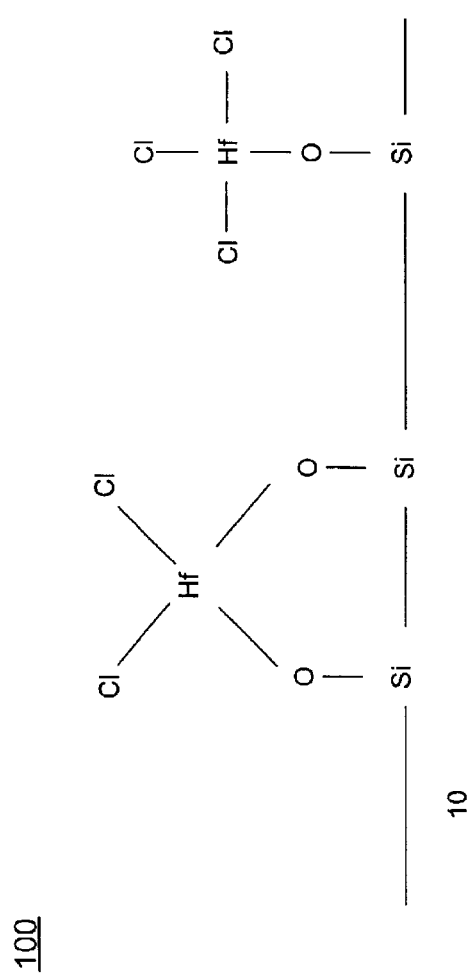

In an exemplary implementation of the present invention, $HfCl_4$ may be provided at a flow rate ranging from about 20 sccm to about 500 sccm for about 10 ms to about 1 second. The hafnium in the $HfCl_4$ may act as the high K material for the dielectric layer. Referring to FIG. 2, the Hf reacts to form bonds with the oxygen atoms. As shown in FIG. 2, the Hf may bond with the oxygen in a number of different ways. For example, the result of the reaction caused by the introduction of the $HfCl_4$ may yield a molecular layer of $(SiO)_xHfCl_{(4-x)}+xHCl$ and/or $SiOHfCl_3+HCl$, as illustrated in FIG. 2. In these reactions, HCl is a byproduct of the reaction.

After the $HfCl_4$ has been provided for the desired time, the $HfCl_4$ source to the reaction chamber is shut off and the reaction chamber is purged to flush all unreacted $HfCl_4$ and the HCl byproduct from the reaction chamber. For example, $N_2$ may be introduced to the reaction chamber at a flow rate ranging from about 100 sccm to about 2000 sccm for a period of about 10 ms to about 10 seconds to purge the reaction chamber.

After the reaction chamber has been purged, the oxygen source may be re-introduced into the chamber. For example, $H_2O$ may be re-introduced at a flow rate ranging from about 20 sccm to about 500 sccm for a period of about 10 ms to about 1 second. Referring to FIG. 3, the oxygen and hydrogen atoms from the $H_2O$ react to form OH bonds with the Hf. An HCl byproduct may also be produced.

After the $H_2O$ has been provided for the desired time, the $H_2O$ source to the reaction chamber is shut off and the chamber is purged to flush all unreacted $H_2O$ and the HCl byproduct from the chamber. For example, $N_2$ may be introduced to the reaction chamber at a flow rate ranging from about 100 sccm to about 2000 sccm for a period of about 10 ms to about 1 second to purge the reaction chamber.

After the reaction chamber has been purged, the hafnium source may be re-introduced into the chamber. For example, $HfCl_4$ may be provided at a flow rate ranging from approximately 20 sccm to about 500 sccm for about 1 ms to about 1 second. Referring to FIG. 4, the Hf reacts to form bonds with the oxygen. HCl may be formed as a byproduct of the reaction.

After the $HfCl_4$ has been provided for the desired time, the $HfCl_4$ source to the chamber is shut off and the reaction chamber is purged to flush all unreacted agents from the chamber. For example, $N_2$ may be introduced to the reaction chamber at a flow rate ranging from about 100 seem to about 2000 sccm for a period of about 10 millisecond to about 10 seconds to purge the reaction chamber.

Figure 5:
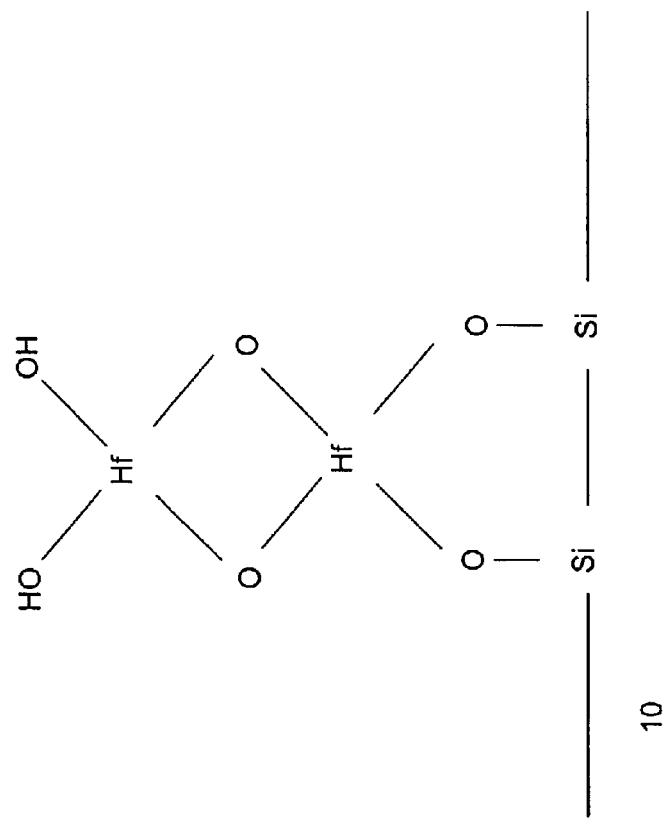

After the reaction chamber has been purged, $H_2O$ may be re-introduced into the chamber at approximately the same flow rates and for the same duration as discussed with respect to FIG. 3. Referring to FIG. 5, the oxygen and hydrogen atoms in the $H_2O$ react to form OH bonds with the Hf, similar to the reaction illustrated in FIG. 3. An HCl byproduct may also be produced.

The process steps described with respect to FIGS. 4 and 5 (i.e., introduction of $HfCl_4$ and $H_2O$) may be repeated a number of times based on the targeted thickness of the dielectric layer. For example, each of the process steps associated with FIGS. 1–5 essentially deposits a monolayer or near monolayer film on the substrate 10. If the desired thickness of the dielectric layer is greater than the thickness obtained by the single series of reactions described with respect to FIGS. 1–5, in addition to the series of reactions described below with respect to FIGS. 6 and 7, the process steps discussed above with respect to FIGS. 4 and 5 may be repeated a number of times.

For example, if the desired thickness of the ultimate dielectric film is 1 nanometer, the process cycle associated with the introduction of the $HfCl_4$ and $H_2O$ may be repeated for 5 to 30 cycles, depending on cycle time. Each of these cycles effectively adds an additional monolayer to the ultimate dielectric layer. After the $HfCl_4$ and $H_2O$ have been cycled into the reaction chamber the desired number of times, the chamber is purged.

After the reaction chamber has been purged, a precursor that acts as a silicon (Si) source may be introduced into the reaction chamber. For example, $SiCl_4$, $SiCl_3H$, $SiCl_2H_2$, $SiClH_3$ and $SiH_4$ may be used as precursors that act as silicon sources for the subsequent reaction.

Figure 6:
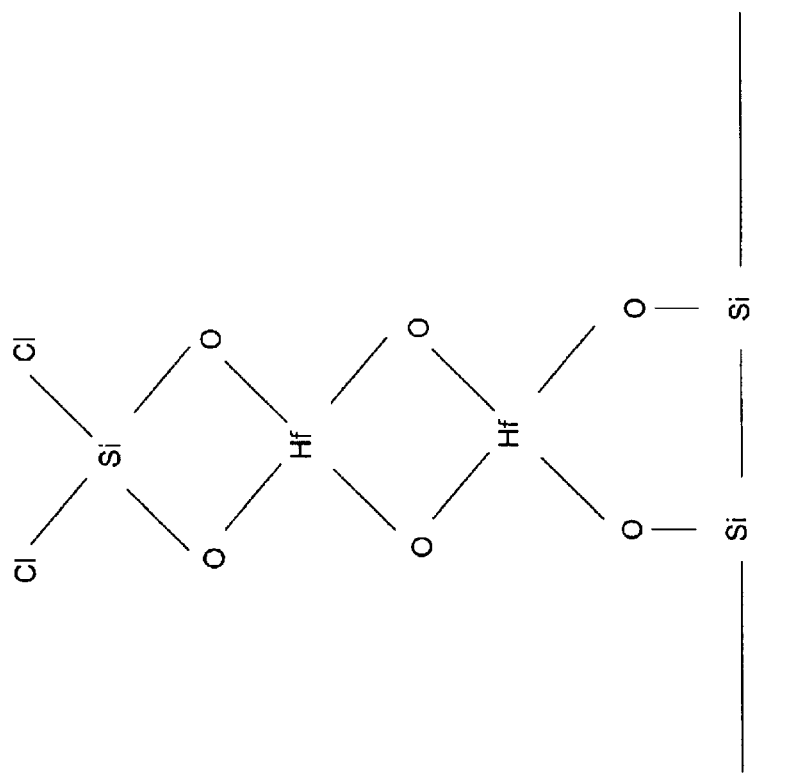

In an exemplary implementation of the present invention, $SiCl_4$ may be provided at a flow rate ranging from about 10 sccm to about 500 sccm for about 1 ms to about 1 second. The silicon in the $SiCl_4$ acts as silicon source for the dielectric layer. Referring to FIG. 6, the silicon in the $SiCl_4$ forms bonds with the oxygen atoms and HCl may be produced as a byproduct of the reaction.

After the $SiCl_4$ has been provided for the desired time, the $SiCl_4$ source to the reaction chamber is shut off and the chamber is purged to flush all unreacted agents from the reaction chamber. For example, $N_2$ may be introduced to the reaction chamber at a flow rate ranging from about 50 sccm to about 2000 sccm for a period of about 10 ms seconds to about 1 second to purge the reaction chamber.

Figure 7:
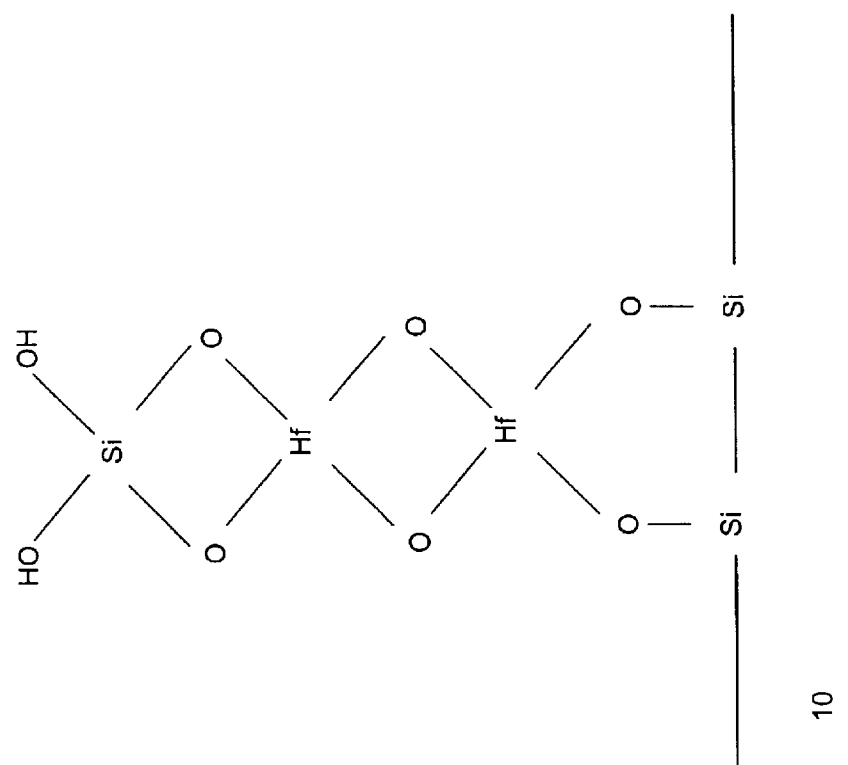
Figure 8:
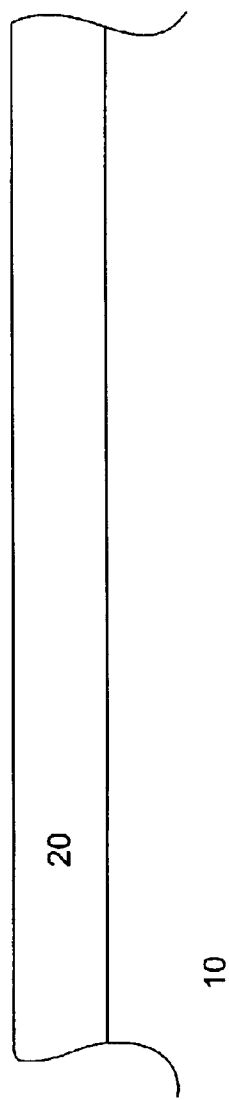

After the chamber has been purged, the oxygen source may be re-introduced into the reaction chamber. For example, $H_2O$ may be provided at a flow rate ranging from about 20 sccm to about 500 sccm for about 10 ms to about 1 second. Referring to FIG. 7, the oxygen and hydrogen atoms in the $H_2O$ react to form OH bonds with the Si. An HCl byproduct may also be produced. The resulting dielectric has the desired composition comprising $HfSi_xO_y$.

After the $H_2O$ has been provided for the desired time, the $H_2O$ source to the chamber is shut off. The reaction chamber may then be purged to flush all unreacted agents from the reaction chamber. For example, $N_2$ may be introduced to the reaction chamber at a flow rate ranging from about 100 sccm to about 2000 sccm for a period of about 10 ms to about 10 seconds to purge the reaction chamber.

The process steps associated with FIGS. 6 and 7 may then be repeated a number of times to achieve the targeted thickness for the dielectric layer. Similar to the discussion above with respect to FIGS. 4 and 5, the process steps described with respect to FIGS. 6 and 7 (i.e., introduction of $SiCl_4$ and $H_2O$) may be repeated a number of times based on the targeted thickness of the dielectric layer.

For example, if the desired thickness of the ultimate dielectric film is 1 nanometer, the process cycle associated with the introduction of the $SiCl_4$ and $H_2O$ may be repeated for 5 to 30 cycles, depending on cycle time. Each of these cycles effective adds an additional monolayer to the ultimate dielectric layer. After the $SiCl_4$ and $H_2O$ have been cycled into the reaction chamber the desired number of times to achieve the targeted thickness, the gas sources may be shut off and semiconductor device 100 may be removed from the reaction chamber.

Semiconductor device 100 may then be annealed. For example, semiconductor device 100 may be annealed at a temperature of about 300 to 900° C. for about 5 seconds to about 180 seconds. The resulting semiconductor device 100 illustrated in FIG. 8 includes substrate 10 and dielectric layer 20. The dielectric layer 20, consistent with the present invention, comprises $HfSi_xO_y$ having the desired thickness and a high K value. The dielectric layer 20 may then be used for any purpose in which a high K film is required. For example, dielectric layer 20 may be used as a gate dielectric layer upon which a gate electrode may be formed. Alternatively, dielectric layer 20 may be used for an interlayer dielectric.

In an alternative embodiment of the present invention, the process step associated with the introduction of $SiCl_4$ into the reaction chamber and illustrated with respect to FIG. 6 may be performed prior to the introduction of $HfCl_4$ illustrated in FIG. 2. In this case, the silicon in the $SiCl_4$ may act as a silicon source with which the subsequently supplied $HfCl_4$ and $H_2O$ will react. The remaining process steps may then proceed in a similar manner as that described above with respect to FIGS. 2–8.

Thus, in accordance with the present invention, the method of forming a dielectric layer results in a dielectric layer having the targeted thickness and high K value. The present methodology may be easily scaled to achieve any targeted thickness for a dielectric film, with the resulting film exhibiting consistent composition throughout. This results in improved reliability for the semiconductor device.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention.

For example, the present invention has mainly been described with respect to an exemplary implementation that uses $H_2O$, $HfCl_4$ and $SiCl_4$ as precursors that act as oxygen, hafnium and silicon sources for reactions with a wafer. However, as discussed previously, other oxygen, hafnium and silicon sources could be used as precursors in alternative implementations consistent with the present invention. One of ordinary skill in the art would be able to optimize the use of these precursors given the guidance provided herein.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a dielectric layer on a semiconductor substrate, comprising:

transporting the semiconductor substrate to a reaction chamber; and providing an oxygen source, a hafnium source and a silicon source to the reaction chamber in a series of separate respective processes, wherein the oxygen source, hafnium source and silicon source react to form a plurality of films on the semiconductor substrate, the films comprising the dielectric layer.

2. The method of claim 1, wherein each of the films comprises a molecular layer and the dielectric layer comprises a gate dielectric layer.

3. The method of claim 1, wherein the oxygen source comprises at least one of $H_2O$, NO, $N_2O$, $O_2$, $O_3$ and O radicals, the hafnium source comprises at least one of $HfCl_4$, $HfCl_3H$, $HfCl_2H_2$ and $HfClH_3$, and the silicon source comprises at least one of $SiCl_4$, $SiCl_3H$, $SiCl_2H_2$, $SiClH_3$ and $SiH_4$.

4. The method of claim 1, wherein the oxygen source comprises $H_2O$ and the hafnium source comprises $HfCl_4$ and the providing the oxygen, hafnium and silicon sources comprises:

providing $H_2O$ to the reaction chamber for a first period of time, purging the reaction chamber after the first period of time, providing $HfCl_4$ to the reaction chamber for a second period of time, purging the reaction chamber after the second period of time, providing $H_2O$ to the reaction chamber for a third period of time, purging the reaction chamber after the third period of time, providing $HfCl_4$ to the reaction chamber for a fourth period of time, purging the reaction chamber after the fourth period of time, and providing $H_2O$ to the reaction chamber for a fifth period of time.

5. The method of claim 4, wherein the silicon source comprises $SiCl_4$ and the providing the oxygen, hafnium and silicon sources further comprises:

purging the reaction chamber after the fifth period of time, providing $SiCl_4$ to the reaction chamber for a sixth period of time, purging the reaction chamber after the sixth period of time, and providing $H_2O$ to the reaction chamber for a seventh period of time.

6. The method of claim 5, wherein the first period of time ranges from about 10 milliseconds (ms) to 1 second, the second period of time ranges from about 10 ms to 1 second, the third period of time ranges from about 10 ms to 1 second, the fourth period of time ranges from about 1 ms to 1 second, the fifth period of time ranges from about 10 ms to 1 second, the sixth period of time ranges from about 1 ms to 1 second and the seventh period of time ranges from about 10 ms to 1 second.

7. The method of claim 6, wherein the $H_2O$ is provided at a flow rate ranging from about 20 sccm to about 500 sccm, the $HfCl_4$ is provided at a flow rate ranging from about 20 sccm to about 500 sccm and the $SiCl_4$ is provided at a flow rate ranging from about 10 sccm to about 500 sccm.

8. The method of claim 1, wherein the providing the oxygen source, hafnium source and silicon source comprises:

providing each of the oxygen, hafnium and silicon sources to the reaction chamber at least once.

9. A method of manufacturing a semiconductor device, comprising:

providing a wafer having an exposed surface comprising silicon;

transporting the semiconductor wafer to a reaction chamber;

alternately providing an oxygen source and a hafnium source to the reaction chamber in a first series of separate respective processes, wherein the oxygen source and hafnium source react with the wafer to form a first plurality of films on the wafer; and alternately providing a silicon source and an oxygen source to the reaction chamber in a second series of separate respective processes, wherein the silicon source and the oxygen source react to form a second plurality of films on the wafer.

10. The method of claim 9, further comprising:

annealing the wafer, wherein the first and second plurality of films comprise a dielectric layer comprising an $HfSi_xO_y$ compound.

11. The method of claim 9, further comprising:

repeating the first series a predetermined number of times.

12. The method of claim 11, further comprising:

repeating the second series a predetermined number of times.

13. The method of claim 9, further comprising:

preparing the reaction chamber as a vacuum chamber.

14. A method of forming a dielectric film, comprising:

placing a semiconductor device having an exposed silicon surface in a reaction chamber;

providing an oxygen precursor, a hafnium precursor and a silicon precursor to the reaction chamber in a series of separate respective processes; and reacting the precursors with the semiconductor device, wherein each reaction results in one of a plurality of films being formed on the semiconductor device and the plurality of films comprise the dielectric film.

15. The method of claim 14, further comprising:

annealing the semiconductor device.

16. The method of claim 14, wherein the alternately providing the precursors to the reaction chamber comprises providing each of the precursors to the reaction chamber at least five times.

17. The method of claim 14, wherein each of the plurality of films comprises a molecular layer and the dielectric film comprises $HfSi_xO_y$.

18. The method of claim 14, further comprising:

preparing the reaction chamber with a pressure ranging from about 10 mTorr to about 500 Torr and a temperature ranging from about 150° C. to about 700° C.

* * * * *